United States Patent
Kraft et al.

(10) Patent No.: US 9,825,598 B2
(45) Date of Patent: Nov. 21, 2017

(54) REAL-TIME COMBINATION OF AMBIENT AUDIO AND A SECONDARY AUDIO SOURCE

(71) Applicant: Doppler Labs, Inc., New York, NY (US)

(72) Inventors: Noah Kraft, New York, NY (US); Richard Fritz Lanman, III, San Francisco, CA (US); Jeff Baker, Newbury Park, CA (US); Gints Klimanis, SunnyVale, CA (US); Anthony Parks, Brooklyn, NY (US); Daniel C. Wiggins, Montecito, CA (US)

(73) Assignee: Doppler Labs, Inc., San Francisco, CA (US)

( * ) Notice: Subject to any disclaimer, the term of this patent is extended or adjusted under 35 U.S.C. 154(b) by 2 days.

(21) Appl. No.: 14/843,684

(22) Filed: Sep. 2, 2015

(65) Prior Publication Data

US 2015/0382106 A1  Dec. 31, 2015

Related U.S. Application Data

(63) Continuation-in-part of application No. 14/681,843, filed on Apr. 8, 2015.
(Continued)

(51) Int. Cl.
| | |
|---|---|
| *H04R 1/00* | (2006.01) |
| *H03F 3/181* | (2006.01) |
| *H04R 1/10* | (2006.01) |
| *H04W 4/02* | (2009.01) |
| *H04W 4/04* | (2009.01) |
| *H04S 5/00* | (2006.01) |

(52) U.S. Cl.
CPC .......... *H03F 3/181* (2013.01); *H04R 1/1083* (2013.01); *H04S 5/00* (2013.01); *H04W 4/02* (2013.01); *H04W 4/043* (2013.01)

(58) Field of Classification Search
CPC .......... H03F 3/181; H04S 5/00; H04W 4/043; H04W 4/02; H04R 1/1083
See application file for complete search history.

(56) References Cited

U.S. PATENT DOCUMENTS

| | | |
|---|---|---|
| 5,566,237 A | 10/1996 | Dobbs et al. |
| 5,576,685 A | 11/1996 | Saito |

(Continued)

FOREIGN PATENT DOCUMENTS

| | | |
|---|---|---|
| EP | 2846328 | 3/2015 |
| WO | 2013069556 | 5/2013 |

*Primary Examiner* — Muhammad N Edun
(74) *Attorney, Agent, or Firm* — Van Pelt, Yi & James LLP

(57) ABSTRACT

A combined ambient sound and secondary audio system comprises at least one microphone for receiving ambient sound, at least one receiver for receiving secondary audio from a secondary audio source not audible in the ambient sound. The system further includes a memory storing one or more sets processing parameters comprising instructions for processing the ambient sound and the secondary audio and a processor coupled to the memory, the microphone, and the receiver configured to generate combined ambient and secondary sound by combining the ambient sound and the secondary audio as directed by a selected set of processing parameters retrieved from the memory.

20 Claims, 6 Drawing Sheets

Related U.S. Application Data

(60) Provisional application No. 61/976,794, filed on Apr. 8, 2014.

(56) References Cited

U.S. PATENT DOCUMENTS

| | | | |
|---|---|---|---|
| 5,604,812 A * | 2/1997 | Meyer | H04R 25/507 381/312 |
| 6,868,162 B1 | 3/2005 | Jubien et al. | |
| 7,283,850 B2 | 10/2007 | Granovetter | |
| 7,391,877 B1 | 6/2008 | Brungart | |
| 8,306,204 B2 | 11/2012 | Erhart et al. | |
| 8,335,312 B2 | 12/2012 | Gerhardt et al. | |
| 8,649,540 B2 | 2/2014 | Killion et al. | |
| 8,718,291 B2 | 5/2014 | Alves et al. | |
| 8,750,544 B2 | 6/2014 | Killion et al. | |
| 9,253,560 B2 | 2/2016 | Goldstein et al. | |
| 2001/0005420 A1 | 6/2001 | Takagi | |
| 2004/0052391 A1 | 3/2004 | Bren et al. | |
| 2008/0112569 A1 | 5/2008 | Asada | |
| 2008/0118078 A1 | 5/2008 | Asada et al. | |
| 2008/0181419 A1 | 7/2008 | Goldstein et al. | |
| 2010/0022269 A1 | 1/2010 | Terlizzi | |
| 2010/0033313 A1 | 2/2010 | Keady et al. | |
| 2010/0086137 A1 | 4/2010 | Nicolino et al. | |
| 2010/0128907 A1 | 5/2010 | Dijkstra | |
| 2010/0146445 A1 | 6/2010 | Kraut | |
| 2010/0172510 A1 | 7/2010 | Juvonen | |
| 2011/0096933 A1 | 4/2011 | Eastty | |
| 2011/0103613 A1 | 5/2011 | Van Der Werf et al. | |
| 2011/0158420 A1 | 6/2011 | Hannah | |
| 2011/0188389 A1 | 8/2011 | Hedley et al. | |
| 2011/0222700 A1 | 9/2011 | Bhandari | |
| 2011/0228950 A1 | 9/2011 | Abrahamsson et al. | |
| 2011/0243344 A1 | 10/2011 | Bakalos et al. | |
| 2011/0293123 A1 | 12/2011 | Neumeyer | |
| 2013/0208909 A1 | 8/2013 | Mulder | |
| 2013/0236040 A1 * | 9/2013 | Crawford | H04S 7/304 381/310 |
| 2014/0044269 A1 | 2/2014 | Anderson | |
| 2014/0046659 A1 | 2/2014 | Burton et al. | |
| 2014/0079243 A1 | 3/2014 | Appell | |
| 2014/0105412 A1 | 4/2014 | Alves et al. | |
| 2014/0185828 A1 | 7/2014 | Helbling | |
| 2014/0198926 A1 | 7/2014 | Killion et al. | |
| 2014/0211972 A1 | 7/2014 | Kim et al. | |
| 2014/0221017 A1 | 8/2014 | Jensen et al. | |
| 2014/0277650 A1 | 9/2014 | Zurek et al. | |
| 2014/0314245 A1 | 10/2014 | Asada et al. | |
| 2014/0314261 A1 | 10/2014 | Selig et al. | |
| 2014/0321660 A1 | 10/2014 | Harsch | |
| 2014/0334644 A1 | 11/2014 | Selig et al. | |
| 2015/0003652 A1 | 1/2015 | Bisgaard et al. | |
| 2015/0063575 A1 | 3/2015 | Tan | |
| 2015/0190284 A1 * | 7/2015 | Censo | G10K 11/175 128/867 |
| 2016/0259619 A1 * | 9/2016 | Appell | G06F 3/165 |

* cited by examiner

REAL-TIME COMBINATION OF AMBIENT AUDIO AND A SECONDARY AUDIO SOURCE

RELATED APPLICATION INFORMATION

This patent is a continuation-in-part of co-pending patent application Ser. No. 14/681,843, entitled "Active Acoustic Filter with Location-Based Filter Characteristics," filed Apr. 8, 2015, which claims priority from provisional patent application 61/976,794, entitled "Digital Acoustical Filters for Use in Human Ears and Method for Using Same", filed Apr. 8, 2014, both of which are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates generally to a system for real-time combination of ambient audio and secondary audio. In particular, this disclosure relates the combination of ambient audio and at least one secondary audio source along with, optionally, performing audio processing on the individual audio sources and on the resulting combined audio.

Description of the Related Art

Human perception of an environment is, at least in part, dependent upon information received by the brain through hearing. Some of this information is obvious, such as noises of individuals moving or coughing, a horn honking on a moving car, the sound of running water, and other similar audible sounds.

Other information that is received auditory is less-obvious. The sounds of echoes (or in smaller spaces nearly-inaudible echoes) inform our senses as to the size of a room or location without actually seeing the location. Whether or not sound reverberates informs our senses as to the material or materials making up a room or space. All of this information can even help with balance and orientation.

Further, we communicate with sound in both spoken word and through audible social cues. Words are spoken and heard by individuals communicating. These words bear meaning and inform each individual as to the intended meaning, thoughts, and actions of the other. Audible social cues can include coughing, sighs, heavy breathing following exercise, coos, and other non-verbal communication.

This symphony of sound, both from other humans and from the environment, continually informs human brains more than most individuals realize.

However, humans sometimes like to hear particular sounds concentrated and alone. For example, individuals often employ earbuds or over-the-ear headphones in order to virtually completely block out outside noise while enjoying a particular audio stream, recording, podcast, or other audio source. The most desirable headphones and earbuds often employ passive or active noise cancellation or attenuation in order to further eliminate outside noises. Presumably, this is so that the user-selected audio source, alone, can be heard, thus increasing the desirability of that experience.

Unfortunately, by inserting ear buds into one's ears or covering one's ears with a traditional over-the-ear headset, an individual blocks most or all ambient audio information, replacing it with a single, other audio source, such as audio played from digital files, from a radio, streamed audio, or from other audio sources.

Throughout this description, elements appearing in figures are assigned three-digit reference designators, where the most significant digit is the figure number where the element is introduced and the two least significant digits are specific to the element. An element not described in conjunction with a figure has the same characteristics and function as a previously-described element having the same reference designator.

DETAILED DESCRIPTION

Some benefit may be derived from the real-time combination of ambient and secondary audio sources. Such a system can enable a wearer to fully experience ambient sound, with both its overt audio aspects (e.g. voice, words, horns, etc.) and its less-obvious audio cues (minor social cues, reverberations, echoes, etc.), in addition to desired secondary audio sources without any substantial loss of the information provided by ambient sound. The ambient audio and/or secondary audio may further clarify, accentuate, or otherwise make the overall combination more positive or more informative for a user of the present system.

As used herein, the phrases "ambient sound" or "ambient audio" means sound in the physical location where a users combined ambient and secondary audio system is present. Ambient audio is further audio that may be heard, either by the users ears in that physical location or while in that physical location with the aid of audio-enhancing technologies. Ambient sound is distinguished from "secondary audio" or "secondary sound" in that secondary sound and secondary audio as used herein means audio that is not audible in the physical location where the user of the combined ambient and secondary audio system is present. Secondary audio can come from many different types of sources, but it is distinctly not in the present physical environment audible to a user of the system. Both ambient sound and secondary audio may be limited to applications for in-ear earbuds or over-the-ear headphones that would, without the reproduction of ambient sound by speakers within the system, otherwise significantly reduce or virtually eliminate ambient sound.

Description of Apparatus

Figure 1:
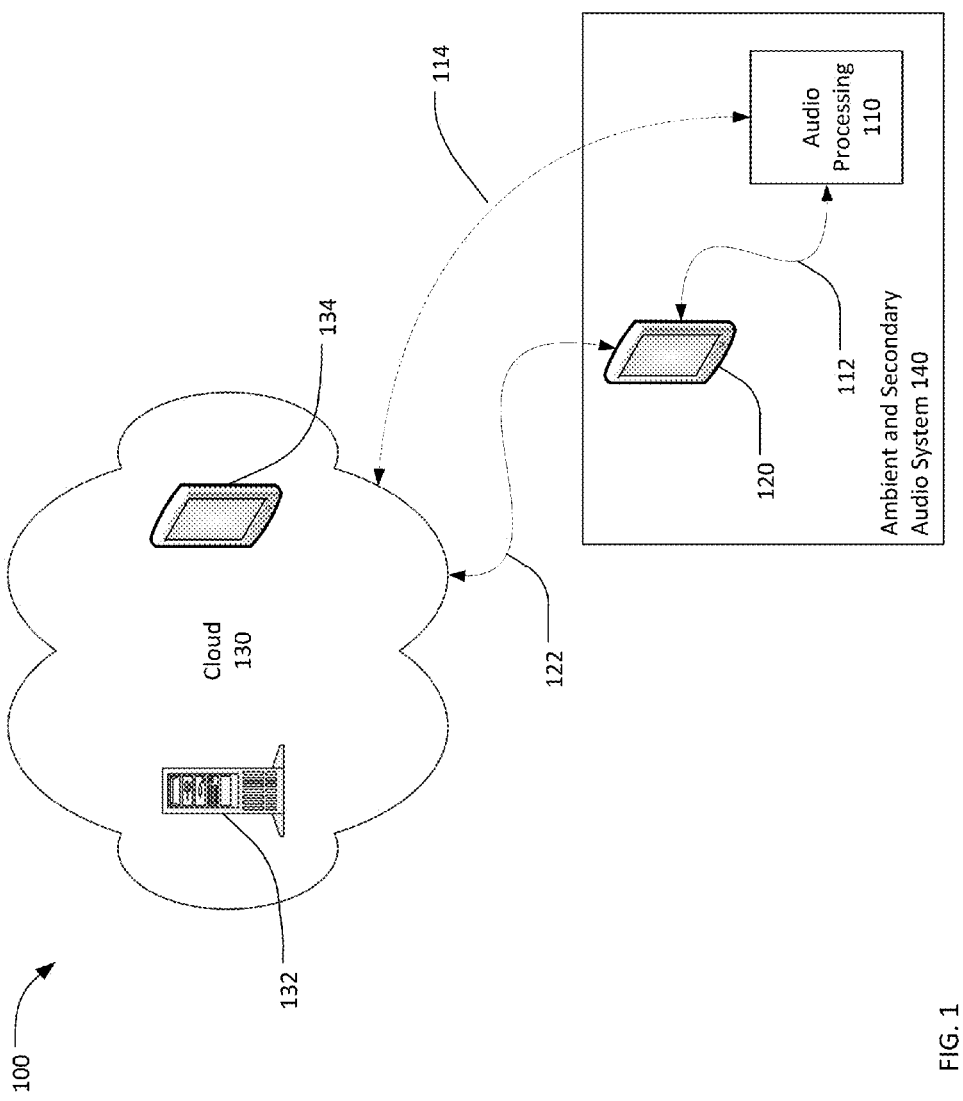
FIG. 1 is a block diagram of an environment.

Referring now to FIG. 1, an environment 100 may include a cloud 130 and an ambient and secondary audio system 140. In this context, the term "cloud" means a network and all devices that may be accessed by the ambient and secondary audio system 140 via the network. The cloud 130 may be a local area network, wide area network, a virtual network, or some other form of network together with all devices connected to the network. The cloud 130 may be or include the Internet. The devices within the cloud 130 may include one or more servers 132 and one or more personal computing devices 134.

The ambient and secondary audio system 140 includes an audio processing system 110 and a personal computing device 120. While the personal computing device 120 is shown in FIG. 1 as a smart phone, the personal computing device 120 may be a smart phone, a desktop computer, a mobile computer, a tablet computer, or any other computing device that is capable of performing the processes described herein.

The personal computing device 120 may include one or more processors and memory configured to execute stored software instructions to perform the processes described herein. For example, the personal computing device 120 may run an application program or "app" to perform some or all of the functions described herein. The personal computing device 120 may include a user interface comprising a display and at least one input device such as a touch screen, microphone, keyboard, and/or mouse. The personal computing device 120 may be configured to perform geo-location, which is to say to determine its own location. Geo-location may be performed, for example, using a Global Positioning System (GPS) receiver or by some other method.

The audio processing system 110 may communicate with the personal computing device 120 via a first wireless communications link 112. The first wireless communications link 112 may use a limited-range wireless communications protocol such as Bluetooth®, Wi-Fi®, ZigBee®, or some other wireless Personal Area Network (PAN) protocol. The personal computing device 120 may communicate with the cloud 130 via a second communications link 122. The second communications link 122 may be a wired connection or may be a wireless communications link using, for example, the WiFi® wireless communications protocol, a mobile telephone data protocol, or another wireless communications protocol.

Optionally, the audio processing system 110 may communicate directly with the cloud 130 via a third wireless communications link 114. The third wireless communications link 114 may be an alternative to, or in addition to, the first wireless communications link 112. The third wireless connection 114 may use, for example, the WiFi® wireless communications protocol, or another wireless communications protocol. Still further, the audio processing system 110 may communicate with the cloud 130 through the second communications link 122 of the personal computing device 120 and the first communications link 112.

Figure 2:
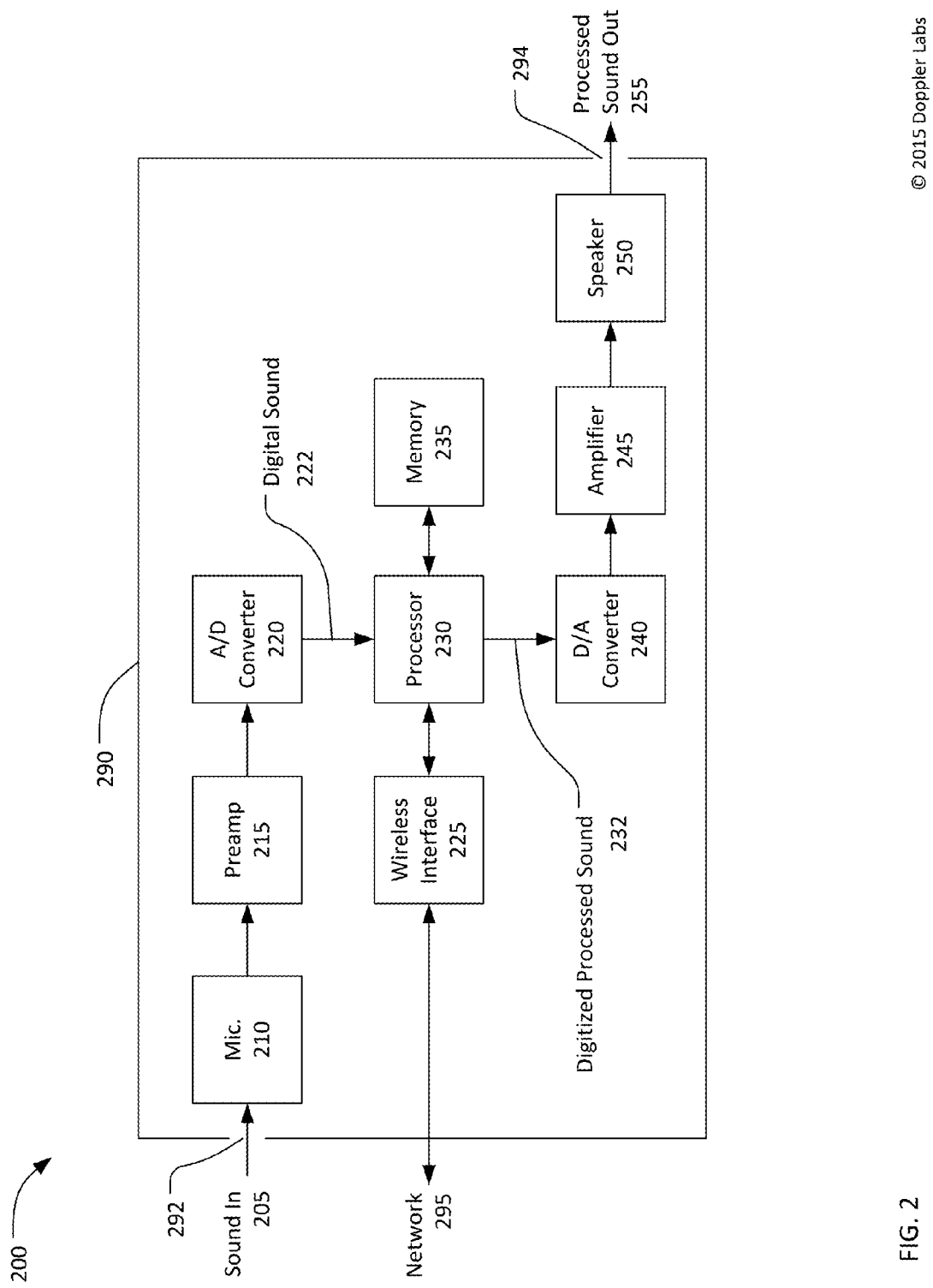
FIG. 2 is block diagram of an audio processing system.

FIG. 2 is block diagram of an audio processing system 200. The audio processing system 200 may include a microphone 210, a preamplifier 215, an analog-to-digital (A/D) converter 220, a wireless interface 225, a processor 230, a memory 235, an analog signal by digital-to-analog (D/A) converter 240, and amplifier 245, a speaker 250, and a battery (not shown), all of which may be contained within a housing 290. The housing 290 may be configured to interface with a user's ear by fitting in, on, or over the user's ear such that ambient sound is mostly excluded from reaching the user's ear canal and processed sound generated by the audio processing system 200 is coupled into the user's ear canal. The housing 290 may have a first aperture 292 for accepting ambient sound and a second aperture 294 to allow processed sound to be output into the user's outer ear canal.

The housing 290 may be, for example, an earbud housing. The term "earbud" means an apparatus configured to fit, at least partially, within and be supported by a user's ear. An earbud housing typically has a portion that fits within or against the user's outer ear canal. An earbud housing may have other portions that fit within the concha or pinna of the user's ear.

The microphone 210 converts received sound 205 (e.g. ambient sound) into an electrical signal that is amplified by preamplifier 215 and converted into digital sound 222 by A/D converter 220. The digital sound 222 may be processed by processor 230 to provide digitized processed sound 232. The processing performed by the processor 230 will be discussed in more detail subsequently. The digitized processed sound 232 is converted into an analog signal by D/A converter 240. The analog signal output from D/A converter 240 is amplified by amplifier 245 and converted into processed output sound 255 by speaker 250.

The depiction in FIG. 2 of the audio processing system 200 as a set of functional blocks or elements does not imply any corresponding physical separation or demarcation. All or portions of one or more functional elements may be located within a common circuit device or module. Any of the functional elements may be divided between two or more circuit devices or modules. For example, all or portions of the analog-to-digital (A/D) converter 220, the wireless interface 225, the processor 230, the memory 235, the analog signal by digital-to-analog (D/A) converter 240, and the amplifier 245 may be contained within a common signal processor circuit device.

The microphone 210 may be one or more transducers for converting sound into an electrical signal that is sufficiently compact for use within the housing 290.

The preamplifier 215 may be configured to amplify the electrical signal output from the microphone 210 to a level compatible with the input of the A/D converter 220. The preamplifier 215 may be integrated into the A/D converter 220, which, in turn, may be integrated with the processor 230. In the situation where the audio processing system 200 contains more than one microphone, a separate preamplifier may be provided for each microphone.

The A/D converter 220 may digitize the output from preamplifier 215, which is to say convert the output from preamplifier 215 into a series of digital ambient sound samples at a rate at least twice the highest frequency present in the ambient sound. For example, the A/D converter may output digital sound 222 in the form of sequential sound samples at rate of 40 kHz or higher. The resolution of the digitized sound 222 (i.e. the number of bits in each sound sample) may be sufficient to minimize or avoid audible sampling noise in the processed output sound 255. For example, the A/D converter 220 may output digitized sound 222 having 12 bits, 14, bits, or even higher resolution. In the situation where the audio processing system 200 contains more than one microphone with respective preamplifiers, the outputs from the preamplifiers may be digitized separately, or the outputs of some or all of the preamplifiers may be combined prior to digitization.

The wireless interface 225 may provide the audio processing system 200 with a connection to one or more wireless networks 295 using a limited-range wireless communications protocol such as Bluetooth®, Wi-Fi®, ZigBee®, or other wireless personal area network protocol. The wireless interface 225 may be used to receive data such as parameters for use by the processor 230 in processing the digital ambient sound 222 to produce the digitized processed sound 232. The wireless interface 225 may be used to receive digital sound, such as audio from a secondary audio source. Alternatively, a hardware interface such as an audio input jack of various known types (not shown) may enable input of digital secondary audio to the processor 230. The wireless interface 225 may also be used to export the digitized processed sound 232, which is to say transmit the digitized processed sound 232 to a device external to the ambient audio processing system 200. The external device may then, for example, store and/or publish the digitized processed sound, for example via social media.

The processor 230 may include one or more processor devices such as a microcontroller, a microprocessor, and/or a digital signal processor. The processor 230 can include and/or be coupled to the memory 235. The memory 235 may store software programs, which may include an operating system, for execution by the processor 230. The memory 235 may also store data for use by the processor 230. The data stored in the memory 235 may include, for example, digital sound samples and intermediate results of processes performed on the digital ambient sound 222. The data stored in the memory 235 may also include a user's listening preferences, and/or rules and parameters for applying particular processes to convert the digital sound 222 into the digitized processed sound 232 prior to output. The memory 235 may include a combination of read-only memory, flash memory, and static or dynamic random access memory.

The D/A converter 240 may convert the digitized processed sound 232 from the processor 230 into an analog signal. The processor 230 may output the digitized processed sound 232 as a series of samples typically, but not necessarily, at the same rate as the digital sound 222 is generated by the A/D converter 220. The analog signal output from the D/A converter 240 may be amplified by the amplifier 245 and converted into processed output sound 255 by the speaker 250. The amplifier 245 may be integrated into the D/A converter 240, which, in turn, may be integrated with the processor 230. The speaker 250 can be any transducer for converting an electrical signal into sound that is suitably sized for use within the housing 290.

The battery (not shown) may provide power to various elements of the audio processing system 200. The battery may be, for example, a zinc-air battery, a lithium ion battery, a lithium polymer battery, a nickel cadmium battery, or a battery using some other technology.

Figure 3:
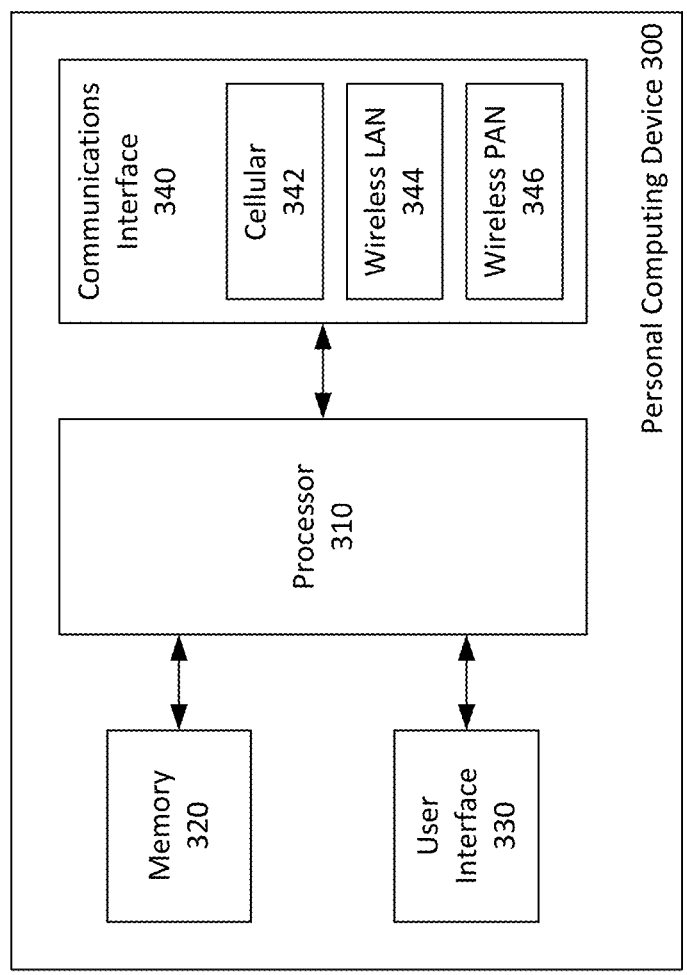
FIG. 3 is a block diagram of a personal computing device.

FIG. 3 is a block diagram of an exemplary personal computing device 300 which may be suitable for the personal computing device 120 within the ambient and secondary audio system 140. As shown in FIG. 3, the personal computing device 300 includes a processor 310, memory 320, a user interface 330, and a communications interface 340. Some of these elements may or may not be present, depending on the implementation. Further, although these elements are shown independently of one another, each may, in some cases, be integrated into another.

The processor 310 may be or include one or more microprocessors, microcontrollers, digital signal processors, application specific integrated circuits (ASICs), or a system-on-a-chip (SOCs). The memory 320 may include a combination of volatile and/or non-volatile memory including read-only memory (ROM), static, dynamic, and/or magnetoresistive random access memory (SRAM, DRM, MRAM, respectively), and nonvolatile writable memory such as flash memory.

The communications interface 340 includes at least one interface for wireless communications with external devices. The communications interface 340 may include one or more of a cellular telephone network interface 342, a wireless Local Area Network (LAN) interface 344, and/or a wireless PAN interface 346. The cellular telephone network interface 342 may use one or more of the known 2G, 3G, and 4G cellular data protocols. The wireless LAN interface 344 may use the WiFi® wireless communications protocol or another wireless local area network protocol. The wireless PAN interface 346 may use a limited-range wireless communications protocol such as Bluetooth®, Wi-Fi®, ZigBee®, or some other wireless personal area network protocol. When the personal computing device is deployed as part of an ambient and secondary audio system, such as the ambient and secondary audio system 140, the wireless PAN interface 346 may be used to communicate with one or more active acoustic filter device 110. The cellular telephone network interface 342 and/or the wireless LAN interface 344 may be used to communicate with the cloud 130.

The communications interface 340 may include radio-frequency circuits, analog circuits, digital circuits, one or more antennas, and other hardware, firmware, and software necessary for communicating with external devices. The communications interface 340 may include one or more processors to perform functions such as coding/decoding, compression/decompression, and encryption/decryption as necessary for communicating with external devices using selected communications protocols. The communications interface 340 may rely on the processor 310 to perform some or all of these function in whole or in part.

The memory 320 may store software programs and routines for execution by the processor. These stored software programs may include an operating system such as the Apple® or Android® operating systems. The operating system may include functions to support the communications interface 340, such as protocol stacks, coding/decoding, compression/decompression, and encryption/decryption. The stored software programs may include an application or "app" to cause the personal computing device to perform portions of the processes and functions described herein.

The user interface 330 may include a display and one or more input devices including a touch screen.

Figure 4:
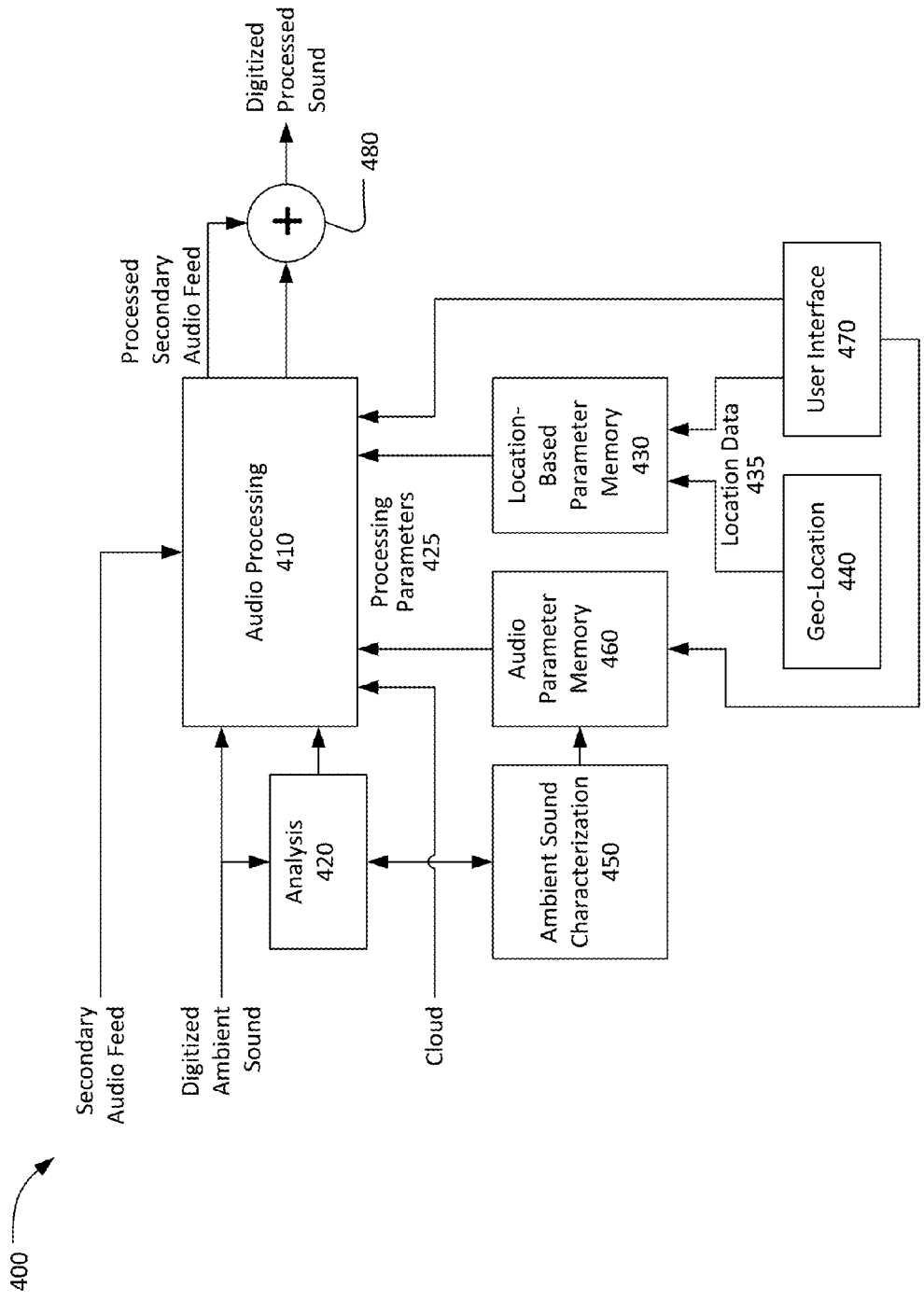
FIG. 4 is a functional block diagram of a portion of a system for combining ambient audio and secondary audio sound.

FIG. 4 shows a functional block diagram of a portion of a system 400, which may be the system 140, for combining ambient audio and secondary audio sound. Digitized ambient sound may be received, for example, from an A/D converter such as the A/D converter 220. The digitized ambient sound is processed by an audio processing function 410 implemented by a processor such as the processor 230. The processor performing the audio processing function may include one or more processor devices such as a microcontroller, a microprocessor, and/or a digital signal processor. The audio processing function 410 may include filtering, equalization, compression, limiting, and other processes. Filtering may include high-pass, low-pass, band-pass, and band-reject filtering. Equalization may include dividing the ambient sound into a plurality of frequency bands and subjecting each of the bands to a respective attenuation or gain. Equalization may be combined with filtering, such as a narrow band-reject filter to suppress a particular objectionable component of the ambient sound. Compression may be used to alter the dynamic range of the ambient sound such that louder sounds are attenuated more than softer sounds. Compression may be combined with filtering or with equalization such that louder frequency bands are attenuated more than softer frequency bands. Limiting may be used to attenuate louder sounds to a predetermined loudness level without attenuating softer sounds. Limiting may be combined with filtering or with equalization such that louder frequency bands are attenuated to a defined level while softer frequency bands are not attenuated or attenuated by a smaller amount. Techniques for implementing filters, compressors, and limiters are known to those of skill in the art of digital signal processing.

The audio processing function 410 may also include adding echo or reverberation to the ambient sound. The audio processing function 410 may also include detecting and cancelling an echo in the ambient sound. The audio processing function 410 may further include noise reduction processing. Techniques to add or suppress echo, to add reverberation, and to reduce noise are known to those of skill in the art of digital signal processing. The audio processing function 410 may include music effects such as chorus, pitch shifting, flanging, and/or "vinyl" emulation (adding scratches and pops to emulation vinyl records). Techniques to add these music effects are known to those of skill in the art of digital signal processing.

The audio processing function 410 may be performed in accordance with processing parameters 425 provided from audio parameter memory 460 and location based parameter memory 430. Multiple processing parameters 425 may be created and stored in the audio parameter memory 460.

The processing parameters 425 may define the type and degree of one or more processes to be performed on the digitized ambient sound (and upon a secondary audio feed). For example, the processing parameters 425 may define filtering by a low pass filter with a particular cut-off frequency (the frequency at which the filter start to attenuate) and slope (the rate of change of attenuation with frequency) and/or compression using a particular function (e.g. logarithmic). For further example, the processing parameters 425 may define the way in which a secondary audio feed is overlayed or combined with the digitized ambient sound. The number and format of the processing parameters 425 may vary depending on the type of audio processing to be performed.

The audio processing function 410 may be defined, in part, based on analysis of the ambient sound by an analysis function 420, which may be implemented by the same processor, or a different processor, as the audio processing function 410. The analysis function 420 may analyze the digitized ambient sound to determine, for example, an overall (i.e. across the entire audible frequency spectrum) loudness level or the loudness level within particular frequency bands. For further example, the analysis function 420 may transform the digitized ambient sound and/or the digitized sound output from the audio processing function 410 into the frequency domain using, for example, a windowed Fourier transform. The transformed sound may then be analyzed to determine the distribution of the ambient sound within the audible frequency spectrum and/or to detect the presence of dominant sounds at particular frequencies. The analysis function 420 may perform other analysis to determine other characteristics of the digitized ambient sound.

A portion of the processing parameters 425 for the audio processing function 410 may define processes dependent on the analysis of the ambient sound. For example, a first processing parameter may require that the overall loudness of the processed sound output from the active acoustic filter system 400 be less than a predetermined value. The analysis function 420 may determine the overall loudness of the ambient sound and the audio processing function 410 may than provide an appropriate amount of overall attenuation The processing parameters 425 may be received or retrieved from several sources. The processing parameters 425 may be received from a user of the ambient and secondary audio system 400. The user may manually enter processing parameters via a user interface 470, which may be the user interface of a personal computing device such as the personal computing device 120. Alternatively, a microphone accessible to the audio processing function 410 (such as mic 210) or a microphone (not shown) in portable computing device 300 may provide input that is used in conjunction with the audio processing function 410 and other processing parameters 425 to adjust the active acoustic filter system 400.

The processing parameters 425 may be received from a device or devices available via a computer network or otherwise available within the cloud 130. For example, a website accessible via the cloud 130 may list recommended sets of processing parameters for different venues, bands, sporting events, and the like. These processing parameters 425 may be generated, in part, based upon feedback regarding the ambient sound from multiple ambient and secondary audio systems like ambient and secondary audio system 140 in communication with one another using the cloud 130. Similarly, a setting change on one of a group of interconnected ambient and secondary audio systems may be propagated to all.

The processing parameters 425 may be, at least in part, location-based, which is to say the processing parameters 425 may be associated with a current location of the ambient and secondary audio system 400. The current location may be a specific location (e.g. "user's living room", "user's office", "Fenway Park", "Chicago O'Hare Airport", etc.) or a generic location (e.g. "sporting event", "dance club", "concert", "airplane", etc.). A location-based parameter memory 430 may store one or more sets of location-based processing parameters in association with data defining respective locations. The appropriate processing parameters may be retrieved from location-based parameter memory 430 based on location data 435 identifying the current location of the ambient and secondary audio system 400.

The location data 435 may be provided by a geo-location function 440. The geo-location function may use GPS, cell tower signal strength, a series of relative-location calculations based upon interconnected ambient and secondary audio systems 140, 140', and 140" or some other technique for identifying the current location. The location data 435 may be provided by the user via the user interface 470. For example, the user may select a location from a list of locations for which processing parameters are stored in the location-based parameter memory 430. The location data 435, particularly for a generic location, may be retrieved from a cloud external to the ambient and secondary audio system 400. The location data 435 may obtained by some other technique.

The one or more sets of location-based processing parameters may have been stored in the location-based parameter memory 430 during prior visits to the corresponding locations. For example, the user of the ambient and secondary audio system 400 may manually set processing parameters for their home and save the processing parameters in the location-based parameter memory 430 in association with the location "home". Similarly, the user may set and save processing parameters for other locations (e.g. "work", "patrol", etc.). Upon returning to these locations (or to locations defined in the negative (not "home", not "work", etc.), the corresponding processing parameters may be automatically retrieved from the location-based parameter memory 430.

The processing parameters 425 may be based, at least in part, upon ambient sound, which is to say the processing parameters 425 may be associated with particular characteristics of the ambient sound. The ambient and secondary audio system 400 may "listen" to the ambient sound and learn what filter parameters the user sets in the presence of various ambient sound characteristics. Once the ambient sound has been characterized, the ambient and secondary audio system 400 may select or suggest processing parameters 425 appropriate for the characteristics of the current ambient sound.

For example, an audio parameter memory 460 may store one or more audio sound profiles identifying respective sets of processing parameters 425 to be applied to ambient audio as those processing parameters 425 have been previously defined by the user, by a manufacturer, by a supervisor, or by an organization of which a wearer is a member for use in a particular environment or situation. Each stored audio sound profile may include characteristics such as, for example, frequencies to attenuate or increase in volume, instructions to emphasize on sounds that already stand out from the overall ambient sound environment (e.g. gunshots, footsteps, dogs barking, human voices, whispers, etc.) while deemphasizing (e.g. decreasing the overall volume) of other ambient sounds, elements of sound to emphasize, aspects to superimpose over ambient audio or identifications of databases and algorithms from which to draw audio for superimposition over ambient audio, locational feedback algorithms for emphasizing locations of certain sounds or frequency ranges, sources of live audio to superimpose over ambient sound or other, similar profiles.

An ambient sound characterization function 450, which may work in conjunction with or in parallel to the analysis function 420, may develop an ambient sound profile of the current ambient sound. The profile determined by the ambient sound characterization function 450 may be used to retrieve an appropriate sound profile, including the associated processing parameters 425 from the audio parameter memory 460. This retrieval may rely in part upon the location data 435 and location-based parameter member 430. These stored ambient sound profiles and processing parameters 425 may direct the system 140 to operate upon ambient sound and/or secondary audio sources in a particular fashion.

The one or more sets of processing parameters 425 making up one or more audio sound profiles may have been stored in the audio parameter memory 460 during prior exposure to ambient sound having particular profiles. The processing parameters 425 may direct the way in which ambient sound and secondary audio are treated by the ambient and secondary audio system 400. These settings may be across-the-board settings such as overall maximum or minimum volume or may be per-audio-source settings such that ambient audio has reverb added, while secondary audio is clean. Similarly, ambient and/or secondary audio may be "spatialized" (made to sound as though they are present at a particular location or distance from the hearer) based upon these processing parameters 425. More detail is provided below.

For example, the user of the ambient and secondary audio system 400 may manually set processing parameters 425 during a visit to a dance club. These processing parameters 425 may be saved in the audio parameter memory 430 in association with the profile of the ambient sound in the dance club. The processing parameters 425 may be saved in the audio parameter memory 430 in response to a user action, or may be automatically "learned" by the active ambient and secondary audio system 400. Upon encountering similar ambient audio, the appropriate processing parameters 425 may be automatically retrieved from the audio parameter memory 460.

While FIG. 4 depicts the audio parameter memory 460 and the location-based parameter memory 430 separately, these may be a common memory that associates each stored set of processing parameters 425 with a location, with an ambient sound profile, or both. Thus, one or both of audio parameters and location-based parameters may be taken into account when selecting or suggesting processing parameters 425 for an ambient and secondary audio system 400.

An adder 480 may add a secondary audio feed to the output from the audio processing function 410 to produce the digitized processed sound. The secondary audio feed may be received by the ambient and secondary audio system 400 from an external source via a wireless communications link and the secondary audio may be processed by the audio processing function 410 before being added to the ambient sound. For example, a user at a sporting event may receive a secondary audio feed of a sportscaster describing the event, which would then be superimposed on the processed ambient sound of the event itself.

The depiction in FIG. 4 of the ambient and secondary audio system 400 as a set of functional blocks or elements does not imply any corresponding physical separation or demarcation. All or portions of one or more functional elements may be located within a common circuit device or module. Any of the functional elements may be divided between two or more circuit devices or modules. For example, all or portions of the audio processing function 410, the analysis function 420, and the adder 480 may be implemented within an ambient and secondary audio system packaged within an earbud or other housing configured to interface with a user's ear. The ambient sound characterization function 450, the audio parameter memory 460 and the location-based parameter memory 430 may be distributed between the ambient and secondary audio system and a personal computing device coupled to the ambient and secondary audio system by a wireless communications link.

Description of Processes

Figure 5:
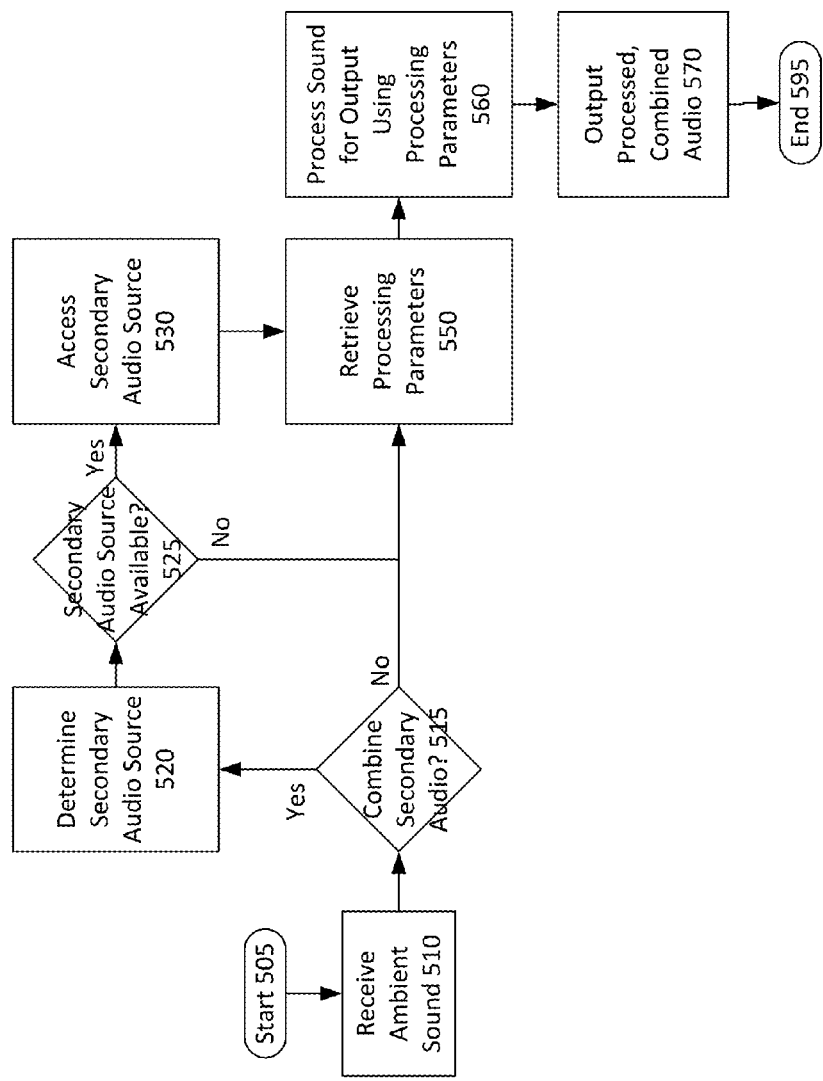
FIG. 5 is a flow chart of a method for combining ambient audio and secondary audio.

Referring now to FIG. 5, a flow chart of a method 500 for combining ambient audio and secondary audio is shown. The process begins at 505 and ends at 595. The process 500 may occur many times, either automatically as ambient sound changes or upon user interaction with a user interface, such as user interface 470 (FIG. 4). The process 500 results in the output of combined ambient audio and audio from a secondary audio source.

First, ambient sound is received at 510. This ambient sound may be merely typical outdoor noise, noise associated with a loud location (e.g. concert, a factory, etc.), noise associated with a quiet location, such that all noises may be increased in volume to aid in hearing, sounds associated with a particular event (e.g. a sporting event, a parade, a conference), or other ambient sounds.

After receipt of the ambient sound 510, a determination is made whether processing parameters indicate that the ambient sound received at 510 is to be combined with secondary audio at 515. This may be, for example, based upon a user selection indicating that the user wishes to combine ambient and secondary audio. Alternatively, this setting may be enabled by default when a secondary audio source is activated by, for example, initiating playback of music stored on a portable computing device or accessing an audio stream or radio station using a device capable of such access.

If secondary audio is to be combined ("yes" at 515), then the source of that secondary audio must be determined at 520. This determination may begin, for example, with a user setting that was set in conjunction with the selection to use secondary audio. This user setting may indicate that a user wishes to draw secondary audio from a radio frequency or satellite broadcast. The setting may, alternatively, indicate that an audio file stored on a local device (e.g. the personal computing device 120) or a remote server, such as a computer server or streaming audio service (e.g. Apple® Music, Pandora®, or similar services), is to be the source of secondary audio.

In some cases, the determination of secondary audio source 520 may be based upon user interaction with a device, such as the personal computing device 120. For example, a user may begin playback of audio from a local audio file or streamed audio source or radio frequency source using the personal computing device 120. The personal computing device may detect that selection, or already have been coupled with and in communication with the ambient and secondary audio system 140 (e.g. by Bluetooth connection) such that when playback begins from whatever secondary source, the audio is combined automatically with ambient sound, rather than replacing that sound. So, the determination at 520 as to the relevant secondary audio source may be, at least in some sense, automatic based upon the initiation of a stream of audio from a secondary audio source.

The determination of a secondary audio source 520 may, alternatively, be controlled by a third party. For example, a user of the system may visit a location at which a secondary audio source is available. The secondary audio source may not begin until a predetermined time and, then, once available, the secondary audio source may be "turned on" by a third party. This third party may be, for example, a broadcaster at a sporting event such as a play-by-play announcer or a broadcast network associated with such an announcer or an audio technician at a musical concert. In the latter case, the secondary audio source may be a live direct-feed from the audio equipment of the audio technician so as to provide a better source of audio from the instruments and/or microphones and thereby provide a higher-quality audio experience to a user while not interrupting the overall concert ambient audio experience.

This live feed may be transmitted using a wireless (or wired) transmitter (not shown) to provide a stream of the secondary audio source (e.g. the live performance). The transmitter may communicate with the communications interface 340 of the personal computing device 300 as discussed above or may communicate directly with, for example, the wireless interface 225 combined ambient and secondary audio system 200. In this way, secondary audio sources that are "streamed" from, for example, an Internet site may be transmitted and received by one or more receivers either in the personal computing device 300 or the system 200. Alternative ways to transmit and receive secondary audio, from whatever source, are known to those of skill in the art.

Next, at 525 a determination is made whether the secondary audio source is available. In the case of initiated audio, the secondary audio source may be available because it was the initiation of the audio stream itself that determined the secondary audio source. However, in cases in which a user, for example, selects a secondary audio source within a personal computing device 120 application, the application may then determine whether that source is available. For example, a user may tune to a particular radio frequency, but if there is nothing but static on that frequency the secondary audio source may not be available ("no" at 525). Similarly, a selected audio stream or file may not be available, for example, if a network is unavailable to a personal computing device 120 so that the stream or file may not be accessed.

If the secondary audio source is available ("yes" at 525), then the secondary audio source is accessed at 530. In some cases, this access may be direct, such as access to a stored data file resident on a personal computing device 120 or a radio frequency freely available to all devices with radio frequency receivers. In other cases, this access may require one or more logins or beginning access to an audio stream. For example, one application on a personal computing device 120 may be used as a user interface for the system 140. The application on the personal computing device 120 may need to access a second application that enables streaming of audio or to access a remote server via a wireless network. The second application or the remote server may require authentication or may interact with the server to initiate access to the secondary audio source. The second application may interact with the first application to provide the requested secondary audio source to the system 140 for combination with the ambient audio.

Next, or if secondary audio is not to be combined ("no" at 515) or if the secondary audio source is not available ("no" at 525), processing parameters are retrieved at 550. These processing parameters 425 may be retrieved from the location-based parameter memory 430 or the audio parameter memory 460. These processing parameters 425 may guide the combination of the secondary audio source with ambient sound. In cases in which there is no direction to combine secondary audio ("no" at 515), the processing parameters 425 may include other instructions regarding modifications to make to the ambient sound. In cases in which the secondary source was unavailable ("no" at 525), the processing parameters 425 may provide instructions on alternative locations for secondary audio or instructions on alternative ways to process ambient sound when secondary audio was expected, but not presently available. For example, the processing instructions may instruction the system 140 to continue requesting the secondary audio source periodically, should it become available at some point as a user is listening.

Finally, the sound is processed for output according to the processing parameters 425 at 560. This process may involve lowering the volume of the ambient sound relative to the secondary audio so as to better-hear the secondary audio, selectively lowering or increasing the volume of aspects of the ambient sound or the secondary audio, equalizing the volumes of the ambient sound and secondary audio, and similar modifications.

The processing according to the processing parameters 425 at 560 may also involve other transformations of the secondary audio and/or ambient sound. This may include spatialization of either audio source (e.g. causing either the ambient sound or secondary audio to appear to a user of a stereo headset to be emanating from a particular direction or location, spatially). The processing may also involve selectively raising or lowering the volume of the secondary audio and/or ambient sound based upon a timer, based upon the detected characteristics of either the secondary audio or ambient sound, or based upon a change of a location.

For the latter, for example, movement of a user of the system 140 to a new location (e.g. from a street into a stadium) may automatically initiate combination of a different secondary audio set with the ambient sound than was previously being used on the street. For example, the user may be listening to music from his or her personal computing device 120 while walking on the street while still hearing ambient sound. Once the user moves into a geo-fenced area identified as a stadium, the secondary audio source may be automatically switched to an in-stadium play-by-play announcer that is broadcast locally via wireless internet or over a radio frequency. The processing parameters may define the desired secondary audio source based, at least in part, upon user location.

Finally, various effects, as determined by user, manufacturer, or supervisor settings stored as processing parameters may be applied, as directed by the processing parameters. These effects, such as equalization, echo, reverb, and other, similar effects may be applied to one or both of the ambient sound or secondary audio as a part of processing the sound for output.

Finally, at 570, the combined and processed ambient sound and secondary audio are output.

Once the output is complete at 570, the process ends at 595. However, the processing at 560 continues using the same processing parameters and generating output at 570 until halted or altered, either by a change in the ambient sound type, by selection (by a user or automatically based upon location or other variable) of a different secondary audio source, or by user interaction. This point, the process may begin again at 505.

Figure 6:
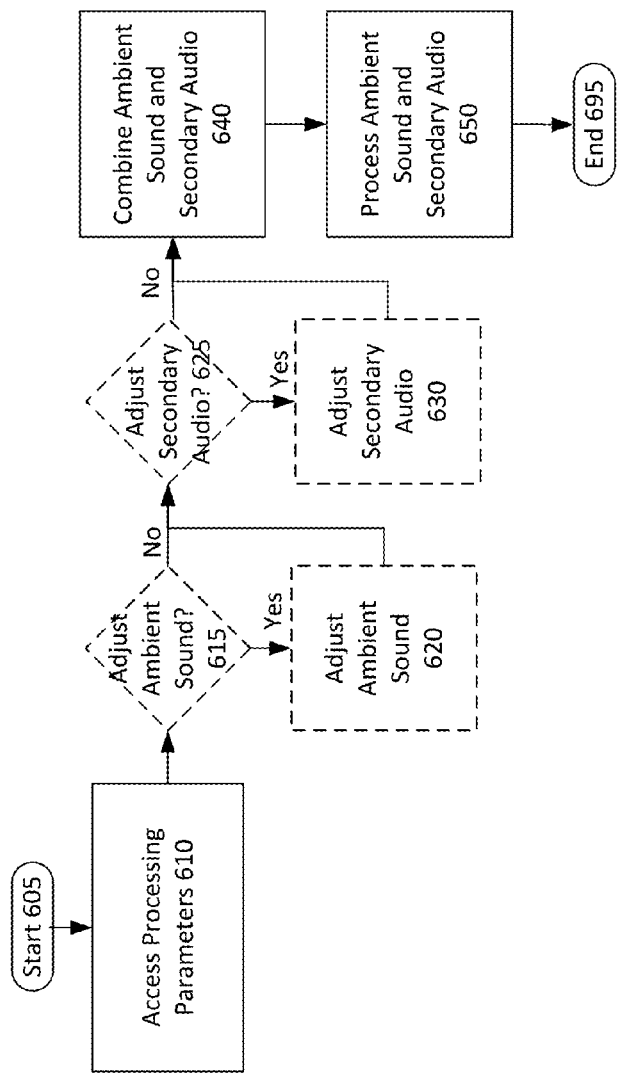
FIG. 6 is a flow chart of a method processing ambient audio, secondary audio, and combined audio.

Referring now to FIG. 6, a flow chart of a process for processing ambient audio, secondary audio, and combined audio is shown. The process 600 begins at 605 and may run continuously until stopped by a user action (not shown). The process 600 may be or be a part of the processing of sound for output using the processing parameters at 560 (FIG. 5). The process 600 may be initiated by a user, may be initiated automatically at regular intervals, or may take place continuously as audio from ambient and secondary sources is received.

First, the processing parameters associated with a selected sound profile are accessed in memory (e.g. audio parameter memory 460 or location-based parameter memory 430) at 610. These processing parameters may affect relatively basic processing of ambient sound or secondary audio that may take place. For example, these may be to lower the volume or to filter out portions of the frequency spectrum entirely. In other cases, these processing parameters may instruct the system to perform complex operations such as applying active noise cancellation or searching for particular types of ambient audio to emphasize (e.g. human speech) using a number of parameters simultaneously and over time. So, as a first step, a determination is made whether the processing parameters include any such adjustments for the ambient sound at 615. If so ("yes" at 615), these adjustments are made to the ambient sound at 620. This step (like step 620) is shown in dashed lines because adjustments to ambient sound maybe optional.

These adjustments to ambient sound at 620 may act as high pass filters or low pass filters, act to equalize the ambient audio, may lower or raise the overall volume of the ambient sound, or may lower or raise the volume of particular ranges of frequencies while performing the opposition operation on other frequencies. For example, all sounds except human voices may be decreased in volume using ranges of generalized frequencies associated with human speech while those same ranges for human voices are increased in volume. If the ambient and secondary audio system is used in the context of a crowd of people, the overall crowd volume may be lowered by removing frequencies of a type that is associated with crowd noises. If the ambient and secondary audio system is used in a location with a great deal of low, throbbing background noise such as a music club or a factory, that noise may be substantially reduced in volume relative to other frequency ranges as a first step to providing combined ambient and secondary audio.

The adjustments may further include audio processing to cause the ambient sound to take on the audio characteristics of a different location. For example, adjustments may alter ambient sounds to incorporate reverbs, echoes and other audio characteristics of locations such as caves, particular recording studios, stadiums, theaters, or outdoor venues. Similarly, the audio characteristics may alter ambient sound to appear as if it is coming from a particular location or type of location such as concentrating the sound in a single three-dimensional location (e.g. to the North of one's present location) or cause it to move from place to place (e.g. travel or move around a location).

The adjustments may further include changes to spatialization. As used herein, the term "spatialization" means altering an audio source such that a sound appears to be coming from a particular location or from a larger distance away or a closer distance. For example, sound may be spatialized by delaying a sound for one ear slightly behind another and altering the higher frequency content to change positioning in the axial plane, alering the frequency content over time by adding a slight reverb, by adding a slight reverb to the overall audio, by changing the reverb characteristics such that the ratio of direct to perceived "reflected" sound is altered to be more-closely like that of sound from a specific distance, or by changing the relative frequency content of the direct sound compared to the perceived reflected sound and by imposing a complex frequency response modeled on the pinnae to alter the perception of the angle of incidence of the sound in three dimensions.

Ambient sound may be "moved" spatially within audio provided to a human ear further away from or closer to a user of the system. In this way, the ambient audio may suggest to a listener that it is more or less important. For example, sirens in ambient sound may be made to sound as though they are incredibly close to a user (closer than they are in reality) to emphasize their urgency or may be localized more strongly in a particular direction so as to emphasize a direction to a user. This may take place while other sounds are localized further away, respectively. This way, the way in which the sound is presented to a listener's ear may, itself, indicate the importance or relevance of the sound.

Similarly, spatialization between ambient audio and a secondary audio source (discussed below) may be altered. Ambient audio may be made to sound more distant while augmented audio is made to sound closer or vice versa. The placement of either may be altered in the audio heard by a user of the system so as to better localize either the ambient audio, an aspect of the ambient audio, or secondary audio.

The spatialization may be automatic, in the case of processing parameters directing either the ambient audio or secondary audio to be present in a particular location or to move closer or further from a user of the system. Alternatively, a user may be presented with a menu, for example, on the personal computing device 120, that enables the user to visibly change the auditory location or auditory distance from a user of aspects of the audio (including ambient or secondary audio). In this way, a user (or the system may automatically) may alter the way in which perceived sounds appear to be present within a virtual sound space that is being provided to the user.

If no adjustments are made ("no" at 615) or following any adjustment at 620, whether the processing parameters call for adjustment to secondary audio is determined at 625. This step is shown in dashed lines (like steps 615, 620, and 630) because adjustments to secondary audio may be optional. Some processing parameters will not include instructions to perform any adjustments on secondary audio.

If the processing parameters call for adjustment of secondary audio ("yes" at 625"), then the secondary audio is adjusted at 630. These adjustments may be similar to or different from the adjustments made to ambient audio described above. The same adjustments may be made or, in most cases, different adjustments may be made. The adjustments to be made may be based upon the type of secondary audio source from which the secondary audio is drawn. For example, secondary audio comprising a music file may be equalized, whereas secondary audio derived from a radio frequency broadcast may be adjusted to remove background noise or crackle, or to only keep frequencies related to human speech while eliminating all other frequencies.

Like the ambient audio, the secondary audio may be adjusted based upon location data 435 (FIG. 4). In particular, specific locations may be associated with different types of secondary audio and/or making specific adjustments to secondary audio. For example, secondary audio may be lowered in volume to match ambient sound, but based upon an individual moving into an arena or concert environment, and the secondary audio being sourced from a direct feed from an audio technician of the audio from the performing artists, the secondary audio volume may be increased to better-simulate or better-blend with the ambient sound so as to feel as though the user is in the concert environment.

By way of a further example, the secondary audio may be audio retrieved from a personal computing device 120 in response to the user of the system 140 being in a particular location. For example, every time an individual goes to the "beach" as determined by the system 140 (e.g. using GPS software and hardware in the personal computing device 120), the individual may wish to have a particular song or soundtrack superimposed over the ambient sound when at that location. Still further, when a user is in that location with a person (as also determined by that person's personal computing device), the ambient and secondary audio system 140 may overlay a particular sound source over the ambient audio while still, in both cases, enabling the user of the system 140 to hear all ambient sounds as well. In this way, life itself can have a soundtrack that does not interfere with normal human reactions. The selection of a song and/or playlist may be learned by the system over time for use in that or those locations.

Secondary audio may include various sources of audio. The ambient sounds combined with the secondary audio may be, in part, based upon the location or characterization of the ambient audio. For example crowd noise at a sporting event may be an ambient audio source, in which case a secondary audio source may be audio from a radio or television broadcast of the sporting event or a local announcer (with that sound accessed directly, for example, by an audio source made available by an audio technician of the sporting event). Still further, the ambient audio may be adjusted according to processing parameters so as to reduce crowd noise, while isolating nearby human voices (e.g. friends and family) so that they may be heard in conjunction with the ambient audio and the secondary audio.

Ambient audio may be processed to isolate and increase the volume of particular conversations at the stadium (e.g. players, coaches, particular individuals). Instead, audio from player, coaches, or particular individuals may be provided as a secondary audio source in place of or in addition to secondary audio from other sources (e.g. an announcer or radio broadcast). In this case, microphones in player helmets or near coaches may provide this secondary audio source.

Alternatively, a secondary audio source may be a spoken audio tour of works of art, exhibits, exhibitions, and similar elements, while the ambient audio may be the audio environment of the museum or exhibition hall along with the voices of nearby friends and family. The system may process the ambient sound to lower the volume (other than nearby speaking voices) and to position the audio tour spatially within the audio space at front and center so that it may most-easily be heard by a listener. Alternatively, all ambient sound may be effectively silences while the audio tour is being presented.

The ambient and secondary audio system may be coupled with voice recognition software and translation software to enable the system to hear ambient spoken words in one language, to perform voice recognition on those words, then to playback as secondary audio a translation of the words in the ambient audio. While doing so, the system may lower the volume of the ambient sound (e.g. including the words), the user presumably does not understand them anyway, while placing the translation in front of and nearby a user spatially.

At a symphony or other musical performance, the ambient audio may be the musical performance, any crowd noise, and any spoken words by nearby patrons. The secondary audio source may be or include live audio spoken by an announcer or someone familiar with the musical pieces, or similar pre-recorded audio, identifying the various movements, or pieces being played. The audio may be carefully-timed or may dynamically determine when musical movements have begun and ended due to changes in the ambient sound characteristics, so as to not interrupt or overlay over the musical pieces. Instead, the secondary audio may be interleaved only between movements.

While providing directions to a destination, either driving or walking, the ambient audio may be typical street or car noises. Secondary audio source may be the audio queues providing the directions. The secondary audio may be spatialized, so as to place the audio "front and center" and at an increased volume relative to the ambient audio, or, alternatively, may be placed in their relative location—e.g. an instruction to turn left may come from a user's "left," while an instruction to turn right may come from a user's "right."

During a live musical event, such as a concert, ambient audio may be or include those noises around an individual including one's friend's voices. The secondary audio source may be or include a live feed, directly from the audio equipment of the concert venue or an audio technician operating the audio equipment. The secondary audio may be slightly delayed so as to accommodate for the slight audio delay when distant from the stage typical at a concert. Alternatively, there may be no delay at all, because the secondary audio source is transmitted and heard effectively instantaneous.

Still further alternatively, during a film or while at home watching a film or a television program or while in a ride or other experience at a theme park, individuals may wear earbuds. The ambient audio may be the typical audio associated with film or ride viewing including the soundtrack, dialogue, and other elements. Simultaneously, additional effects may be added as a secondary audio source. The secondary audio may be spatialized so that actions or noises that are off-screen, for example behind the viewer, may "sound" as though they are behind the viewer without effecting the overall ambient audio experience.

Still further alternatively, at an auto racing or motorcycle racing event, the noise of the event including the car or motorcycle noise may be quite loud compared with the other ambient sounds such as voices of one's friends in the crowd. Secondary audio, such as an audio feed of an announcer for the event or similar audio may be combined with the ambient audio. Simultaneously, the ambient audio may be processed so that the engine noise is dramatically reduced. In this way, the user can hear his or her friends speak, hear the roar of the crowd, and still experience the ambient atmosphere of the event, while not being subjected to the loud engine noises and, simultaneously, may hear the secondary audio source.

An individual walking through a physical location may still hear the ambient sound, while being presented with relevant audio information as secondary audio. For example, an individual walking by a display case including products may be presented with information, a coupon, a discount, free shipping, we-pay-the-tax or other offers while still heaving the ambient audio. While the secondary audio is presented, the ambient audio may be reduced in volume. Similarly, the secondary audio may be spatialized relative to the products (e.g. on a user's right or left) or may be placed in "front" of a user in order to obtain better focus or importance in the user's mind.

Similarly, while travelling through a city or amusement park or other unfamiliar location, a user may continue to hear ambient audio, while secondary audio of information regarding the location is provided. This secondary audio may be guidance to a next destination, it may be information regarding ticket availability, it may be information regarding seating, or other, similar information. Simultaneously, if desired, aspects of the ambient audio may be filtered.

An individual on a golf course, participating in a football game, other sporting event, or exercise may hear all ambient noise associated with a the event, but also receive instructions or suggestions from a caddy, coach, or other individual. Simultaneously, if desired, the crowd noise associated with the event may be reduced or eliminated.

While riding a bike, a scooter, or an all terrain vehicle, ambient noise may still be heard, for safety, while secondary audio of live, pre-recorded, or streamed audio may be provided to a user at a higher volume than the ambient audio. The system may dynamically increase ambient audio and decrease the secondary audio in situations where safety is important (e.g. if the ambient audio characterization detects that an exterior sound may be a danger such as an ambulance siren, a police siren, or other dangerous noise).

While watching television, the ambient audio of a television presentation (e.g. sporting event) may be provided to a user while, simultaneously, a secondary audio stream of a different audio source may be provided over the ambient audio. Portions of the ambient audio, such as an undesirable sports commentator or television spokesperson may be eliminated from the ambient audio or reduced in volume, while audio from a secondary source may be provided in its place. This secondary audio may be, for example, a local color commentator or a favorite radio announcer (e.g. the local announcer for a favored team).

Similarly, while in a physical location a user may be provided with information pertaining to that location as secondary audio while not interrupting the ambient audio. For example, a user visiting a location of one or more scenes in a famous film may be provided with commentary regarding the film and/or location as secondary audio based upon the location awareness of the system while simultaneously hearing the ambient sound. Alternatively, this audio may be a reading of an audio book related to the location.

A tutorial may be provided as secondary audio when requested, such as a repair tutorial or other instructions. Ambient audio may not be inhibited by the playback of the secondary audio instructions. The system may be combined with voice recognition capabilities, such that the secondary audio instructions may be provided in response to an auditory request for the instructions. The secondary audio may, instead, be information prompted by a voice request, such as information regarding content being watched (e.g. an actor on a television series or movie) prompted by a voice request or other request. The information may be overlaid on the ambient audio.

Ambient sound may remain relatively constant while speech, selected from a predetermined group of people (e.g. a friends list or members in an on-going audio chat session) may be overlaid onto the ambient audio. In this way, a user may be able to carry on relatively normal day-to-day activities, while simultaneously being in communication with (e.g. using a microphone) and hearing communication from the predetermined group of people. Ambient sounds may remain relatively unchanged, optionally with volume lowered, while secondary audio from the predetermined group is audible at a slightly-higher volume.

While dining at a restaurant, ordering coffee or a drink, while waiting for a table or while waiting in line, for example at a theme park, ambient audio of one's surroundings may be provided by the system while secondary audio may provide updates on the status of meal preparation, table availability, or expected wait times in line for one or more attractions. This secondary audio may be provided by radio frequency to all individuals with appropriate hardware or may be provided specifically to a particular individual based upon, for example, a user account associated with an individual, a wait list, or a line.

While travelling in a car, ambient audio may continue to be provided by the system while providing specific, location-based information pertaining to traffic, accidents, road closures or other information. Real-time updates of rerouting may also be provided. Other secondary sources, such as music from a personal computing device 300 may continue to be provided while the update is announced.

These and other sources of ambient and secondary audio may be used.

Next, the adjusted ambient sound and secondary audio are combined at 640. This combination may be or include the formation of a single set of digital audio combining the ambient sound and the secondary audio or, alternatively, may only be the simultaneous and synchronized playback of the two audio sources.

Once the ambient sound and secondary audio are adjusted at 620 and 630 and once the ambient and secondary audio are combined at 640, the combined sound is processed at 650. In this final phase, the combined ambient sound and secondary audio may be processed. This may include audio processing that is applied, equally, to each of the audio sources. For example, the volume may be adjusted, the combined audio may be equalized or other audio adjustment operations may be performed on the combined audio.

The process 600 for adjusting ambient audio, secondary audio, and combined audio operates continuously as ambient audio is received. Nonetheless, the processes repeated are substantially identical until a different location is reached, a different set of processing parameters is selected, or a different secondary audio source is selected, either automatically or by a user. This process ends at 695, but may continue so long as ambient audio and/or secondary audio is received by the system 140.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A combined ambient sound and secondary audio source system, comprising:
   at least one microphone for receiving ambient sound;
   at least one receiver for receiving secondary audio from a secondary audio source not audible in the ambient sound;
   a memory storing one or more sets of processing parameters comprising instructions for processing the ambient sound and the secondary audio; and
   a processor coupled to the memory, the microphone, and the receiver, wherein the processor is configured to:
      determine a geo-location associated with the combined ambient sound and secondary audio source system; and
      generate combined ambient and secondary sound at a predetermined time selected by a provider of the secondary sound by automatically combining the ambient sound and the secondary audio based on the geo-location and as directed by a selected set of processing parameters retrieved from the memory.

2. The combined ambient sound and secondary audio system of claim 1 wherein the secondary audio includes one of the following: a stored audio file on an audio playback device, a stream of audio received via the Internet, a radio frequency broadcast of audio, a stream of audio broadcast via a satellite, audio received from audio equipment at a live event, and audio comprising a voice of an individual using a microphone transmitted as the secondary audio source.

3. The combined ambient sound and secondary audio system of claim 1 wherein the one or more sets of processing parameters further include instructions for altering the combined ambient and secondary sound by reducing a volume or attenuating at least one frequency range within one of the ambient sound and the secondary audio.

4. The combined ambient sound and secondary audio system of claim 1 wherein the processor is further configured to alter a spatialization of one of the ambient sound and the secondary audio.

5. The combined ambient sound and secondary audio system of claim 1, further comprising:
   audio equipment for a live performance including an audio component;
   an analog to digital converter for converting at least a portion of the audio component into the secondary audio; and
   a transmitter for transmitting the secondary audio to the at least one receiver.

6. The combined ambient sound and secondary audio system of claim 1 further comprising a personal computing device, coupled to the processor via a wireless communication link.

7. The combined ambient sound and secondary audio system of claim 6, wherein the personal computing device operates as the secondary audio source, the personal computing device comprising:
   a second memory storing audio files comprising the secondary audio;
   a transmitter for transmitting the secondary audio to the at least one receiver; and
   a second processor for accessing the secondary audio in the second memory and directing the transmitter to transmit the secondary audio to the at least one receiver.

8. The combined ambient sound and secondary audio system of claim 6 wherein the personal computing device operates as the secondary audio source, the personal computing device comprising:
   a second receiver for receiving audio comprising the secondary audio;
   a transmitter for transmitting the secondary audio to the at least one receiver; and
   a second processor for accessing the secondary audio from the second receiver and directing the transmitter to transmit the secondary audio to the at least one receiver.

9. The combined ambient sound and secondary audio system of claim 8 wherein the second receiver is one of a radio frequency receiver, a wireless network receiver, and a satellite receiver.

10. The combined ambient sound and secondary audio system of claim 1, further comprising:
    a housing enclosing at least a portion of the processor and at least a portion of the memory;
    a preamplifier, and an analog to digital converter to convert ambient sound into digitized ambient sound input to the processor; and
    a digital to analog converter, an amplifier, and a speaker to convert digitized processed sound output from the processor into processed output sound, wherein
    the at least one microphone, the preamplifier, the analog to digital converter, the digital to analog converter, the amplifier, and the speaker are disposed within the housing.

11. The combined ambient sound and secondary audio system of claim 10, wherein the housing is an earbud housing configured to fit, at least partially, within and be supported by a user's ear.

12. A method for combining ambient sound and secondary audio, comprising:
- receiving ambient sound using at least one microphone;
- receiving, at a receiver, secondary audio from a secondary audio source not audible in the ambient sound;
- storing in a memory one or more sets of processing parameters comprising instructions for processing the ambient sound and the secondary audio;
- determining a geo-location associated with the combined ambient sound and secondary audio source system; and
- generating combined ambient and secondary sound at a predetermined time selected by a provider of the secondary sound by automatically combining the ambient sound and the secondary audio based on the geo-location and as directed by a selected set of processing parameters retrieved from the memory.

13. The method of claim 12 wherein the secondary audio includes one of the following: a stored audio file on an audio playback device, a stream of audio received via the Internet, a radio frequency broadcast of audio, a stream of audio broadcast via a satellite, audio received from audio equipment at a live event, and audio comprising a voice of an individual using a microphone transmitted as the secondary audio source.

14. The method of claim 12 wherein the one or more sets of processing parameters further include instructions for altering combined ambient and secondary sound by reducing the volume or attenuating at least one frequency range within one of the ambient sound and the secondary audio.

15. The method of claim 12 further comprising altering a spatialization of one of the ambient sound and the secondary audio.

16. The method of claim 12, wherein a personal computing device operates as the secondary audio source, the personal computing device for:
- storing in a second memory audio files comprising the secondary audio;
- transmitting, using a transmitter, the secondary audio to the receiver; and
- accessing the secondary audio in the second memory and directing the transmitter to transmit the secondary audio to the receiver.

17. The method of claim 12 wherein the secondary audio source is a personal computing device, the personal computing device comprising:
- receiving, at a second receiver, audio comprising the secondary audio;
- transmitting, using a transmitter, the secondary audio to the receiver; and
- accessing the secondary audio from the second receiver and directing the transmitter to transmit the secondary audio to the at least one receiver.

18. The method of claim 17, further comprising:
- capturing an audio component using audio equipment for a live performance;
- converting at least a portion of the audio component into the secondary audio; and
- transmitting the secondary audio to the second receiver.

19. The method of claim 17 wherein the second receiver is one of a radio frequency receiver, a wireless network receiver, and a satellite receiver.

20. A computer program product for combining ambient sound and secondary audio, the computer program product being embodied in a non-transitory computer readable storage medium and comprising computer instructions for:
- receiving ambient sound using at least one microphone;
- receiving, at a receiver, secondary audio from a secondary audio source not audible in the ambient sound;
- storing in a memory one or more sets of processing parameters comprising instructions for processing the ambient sound and the secondary audio;
- determining a geo-location associated with the combined ambient sound and secondary audio source system; and
- generating combined ambient and secondary sound at a predetermined time selected by a provider of the secondary sound by automatically combining the ambient sound and the secondary audio based on the geo-location and as directed by a selected set of processing parameters retrieved from the memory.

* * * * *